(12) United States Patent
Kavalieros et al.

(10) Patent No.: US 8,148,786 B2
(45) Date of Patent: Apr. 3, 2012

(54) COMPLEMENTARY METAL OXIDE SEMICONDUCTOR INTEGRATED CIRCUIT USING RAISED SOURCE DRAIN AND REPLACEMENT METAL GATE

(75) Inventors: Jack Kavalieros, Portland, OR (US); Annalisa Cappellani, Portland, OR (US); Justin K. Brask, Portland, OR (US); Mark L. Doczy, Beaverton, OR (US); Matthew V. Metz, Hillsboro, OR (US); Suman Datta, Beaverton, OR (US); Chris E. Barns, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/493,291

(22) Filed: Jun. 29, 2009

(65) Prior Publication Data

US 2009/0261391 A1    Oct. 22, 2009

Related U.S. Application Data

(62) Division of application No. 11/159,430, filed on Jun. 21, 2005, now Pat. No. 7,569,443.

(51) Int. Cl.
*H01L 21/76* (2006.01)
(52) U.S. Cl. ............... 257/401; 257/388; 257/E29.158
(58) Field of Classification Search ............ 257/19, 257/401, 388, 412, E29.158; 438/300
See application file for complete search history.

(56) References Cited

U.S. PATENT DOCUMENTS

| | | | | |
|---|---|---|---|---|
| 6,770,521 B2 * | 8/2004 | Visokay et al. | ............ | 438/199 |
| 6,787,424 B1 * | 9/2004 | Yu | ............ | 438/300 |
| 7,413,957 B2 * | 8/2008 | Nouri et al. | ............ | 438/300 |
| 7,579,231 B2 * | 8/2009 | Matsuo et al. | ............ | 438/216 |

OTHER PUBLICATIONS

Uchino et al., "A Raised Source/Drain Technology Using In-situ P-doped SiGe and B-doped Si for 0.1-.mu.m CMOS ULSIs," 1997 IEEE IEDM Tech. Dig., pp. 479-482.*

* cited by examiner

*Primary Examiner* — Quoc Hoang
(74) *Attorney, Agent, or Firm* — Trop, Pruner & Hu, P.C.

(57) ABSTRACT

A complementary metal oxide semiconductor integrated circuit may be formed with a PMOS device formed using a replacement metal gate and a raised source drain. The raised source drain may be formed of epitaxially deposited silicon germanium material that is doped p-type. The replacement metal gate process results in a metal gate electrode and may involve the removal of a nitride etch stop layer.

5 Claims, 7 Drawing Sheets

COMPLEMENTARY METAL OXIDE SEMICONDUCTOR INTEGRATED CIRCUIT USING RAISED SOURCE DRAIN AND REPLACEMENT METAL GATE

CROSS-REFERENCE TO RELATED APPLICATIONS

This application is a divisional of U.S. patent application Ser. No. 11/159,430, filed on Jun. 21, 2005 now U.S. Pat. No. 7,569,443.

BACKGROUND

This invention relates generally to the fabrication of integrated circuits.

To increase performance of NMOS and PMOS deep submicron transistors in CMOS technology, current state-of-the-art technology uses compressive stress in the channel of the PMOS transistors, and tensile stress in the case of NMOS transistors.

Existing technologies that use strained channels are subject to a number of limitations. For example, polysilicon depletion may occur in the PMOS devices. In addition, tensile strain may arise in the PMOS devices. Remaining tensile strain degrades hole mobility in the PMOS devices.

Thus, there is a need for a better complementary metal oxide semiconductor process and particularly one which improves the performance of PMOS devices.

DETAILED DESCRIPTION

Figure 1:
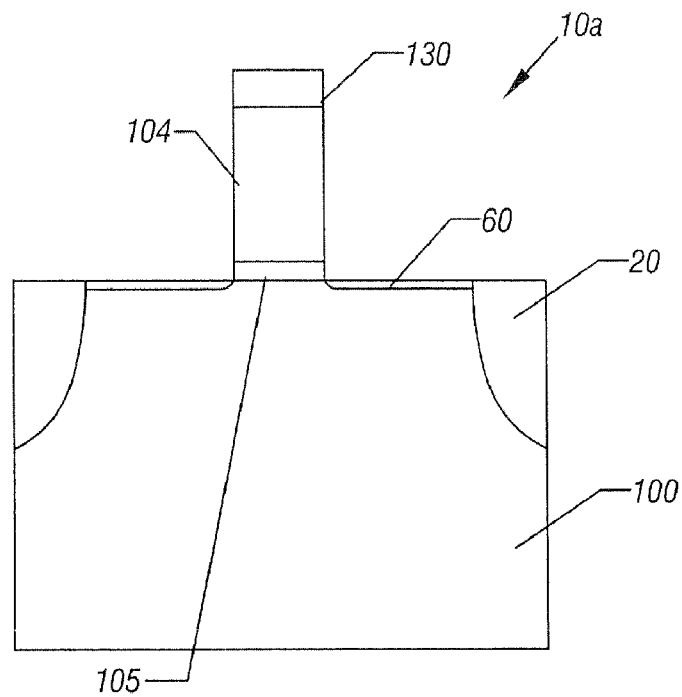
FIG. 1 is an enlarged, cross-sectional view of an PMOS transistor at an early stage of manufacture.
Figure 2:
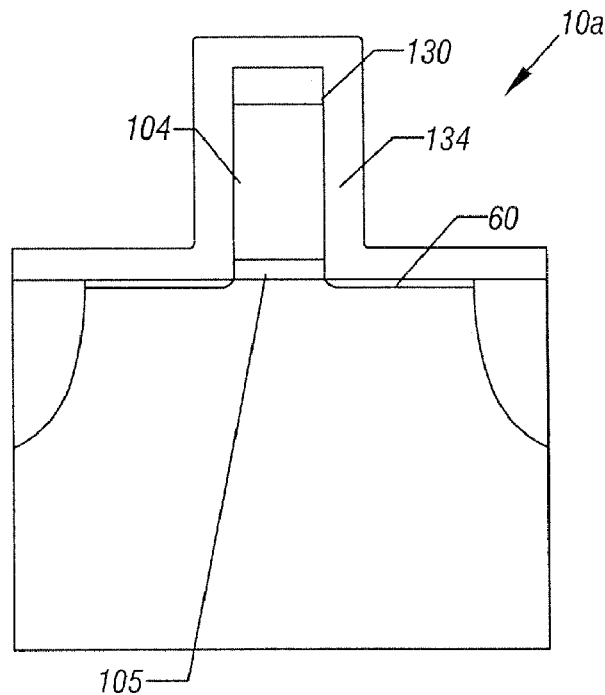
FIG. 2 is an enlarged, cross-sectional view of a PMOS transistor at a subsequent stage of manufacture.

The fabrication of the PMOS transistor of a complementary pair proceeds as shown in FIGS. 1-13. On both the NMOS and PMOS sides a silicon dioxide gate oxide 105 may be deposited in one embodiment. The gate oxide 105 may be covered by a gate material 104, such as polysilicon, in turn covered by a hard mask 130 for patterning. Then the gate material 104 and gate dielectric 105, such as oxide, are patterned to generate the FIG. 1 structure on the PMOS side 10a. The gate dielectric may be about 15 Angstroms thick and may be thermally grown in one embodiment.

Substrate 100 may comprise a bulk silicon or silicon-on-insulator substructure. Alternatively, substrate 100 may comprise other materials—which may or may not be combined with silicon—such as: germanium, indium antimonide, lead telluride, indium arsenide, indium phosphide, gallium arsenide, or gallium antimonide. Although a few examples of materials from which substrate 100 may be formed are described here, any material that may serve as a foundation upon which a semiconductor device may be built falls within the spirit and scope of the present invention. Shallow trench isolation region 20 may comprise silicon dioxide, or other materials that may separate the transistor's active regions.

Gate material 104 may comprise polysilicon and may, for example, be between about 100 and about 2,000 Angstroms thick and between about 500 and about 1,600 Angstroms thick in one embodiment. Hard mask 130 may comprise silicon nitride and may, for example, be between about 100 and about 500 Angstroms thick and between about 200 and about 350 Angstroms thick in one embodiment.

A tip or lightly doped source drain 60 may be formed using the gate structure as a mask. Ion implantation may be used to form the source drain 60.

When gate material 104 comprises polysilicon, and hard mask 130 comprises silicon nitride, the FIG. 1 structure may be made in the following way. A dummy dielectric layer, which may comprise silicon dioxide, is formed on substrate 100 (e.g., via a conventional thermal growth process), followed by forming a polysilicon layer on the dielectric layer (e.g., via a conventional deposition process). Using conventional deposition techniques, a silicon nitride layer is formed on the polysilicon layer. The silicon nitride, polysilicon, and dummy dielectric layers are then patterned to form patterned silicon nitride layer, patterned polysilicon layer, and patterned dielectric layer. When the dielectric layer comprises silicon dioxide, one may apply routine etch processes to pattern the polysilicon and dummy dielectric layers.

Figure 3:
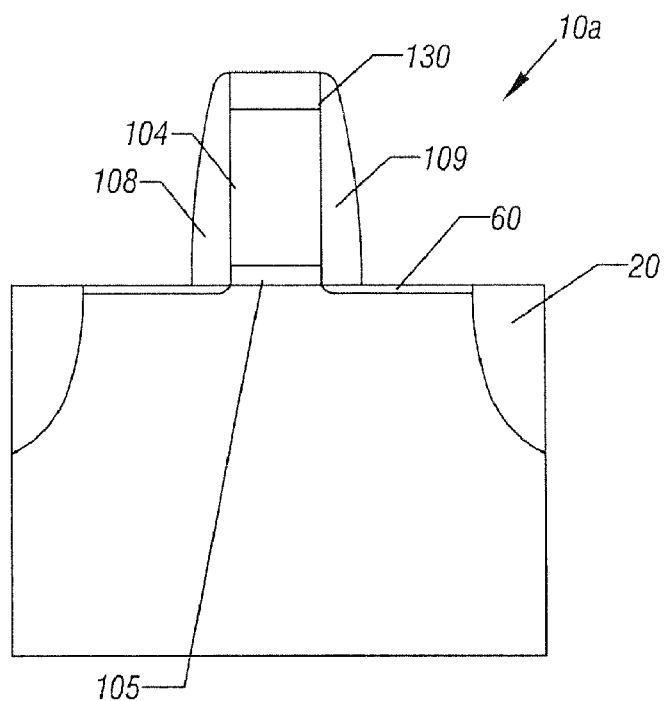
FIG. 3 is an enlarged, cross-sectional view at a stage subsequent to the stage shown in FIG. 2 in accordance with one embodiment of the present invention.

A nitride spacer material 134 may be deposited (FIG. 2) and anisotropically etched to form sidewall spacers 108, 109, shown in FIG. 3. The spacers 108, 109 may be on the order of 1000 Angstroms thick.

Figure 4:
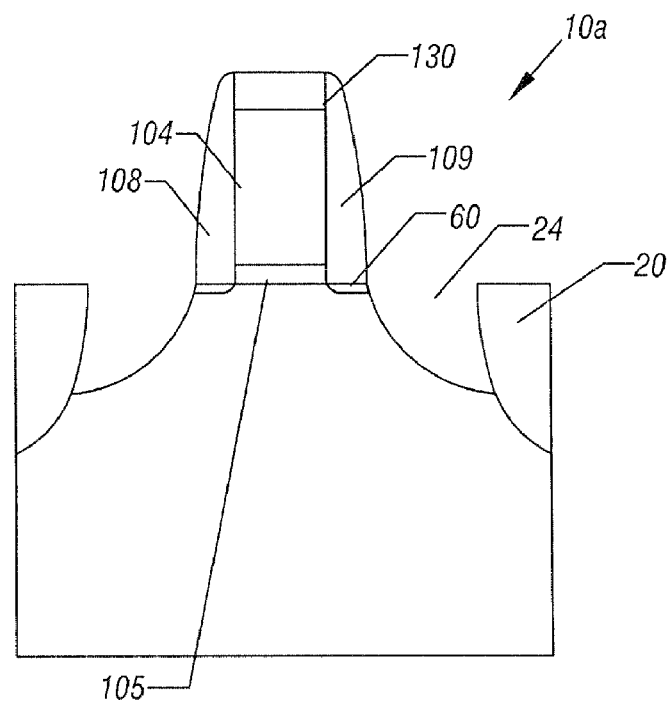
FIG. 4 is an enlarged, cross-sectional view at a stage subsequent to the stage shown in FIG. 3 in accordance with one embodiment of the present invention.

A trench 24 is formed into the substrate 100, as shown in FIG. 4. The trench 24 may be formed by reactive ion etching using $SF_6$ chemistry. The etching is constrained by the isolation 20 on one side and, in one embodiment, does not substantially isotropically undercut the gate structure on the other side. As a result, an isotropic etch profile may be achieved on the inward edges of the trench 24 as shown in FIG. 4, while leaving a portion of the lightly doped source drain 60. During this step the NMOS side 10b may be covered by an oxide mask (not shown).

Figure 5:
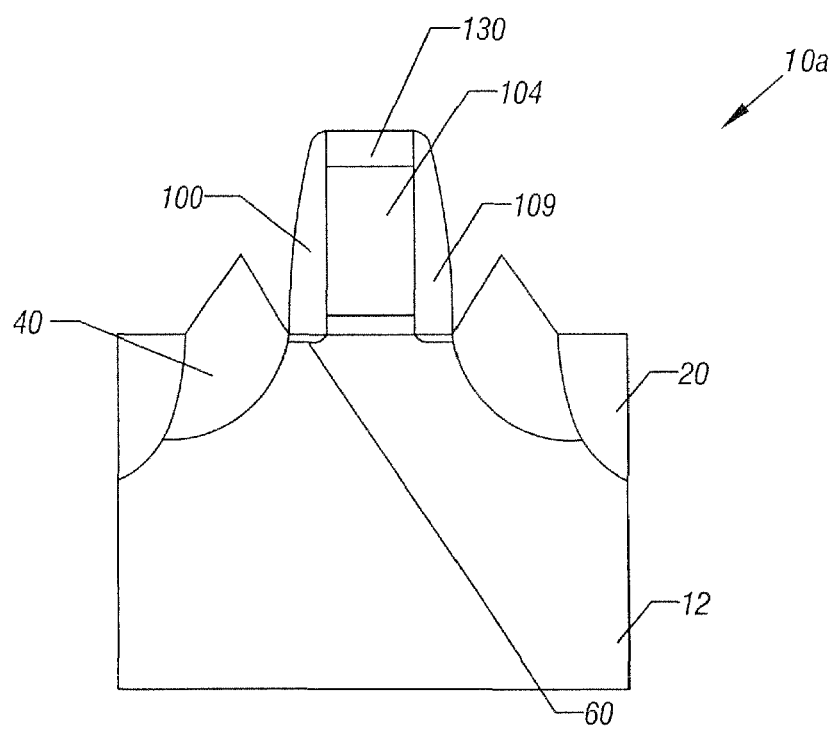
FIG. 5 is an enlarged, cross-sectional view at a stage subsequent to the stage shown in FIG. 4 in accordance with one embodiment of the present invention.

Then, an epitaxial silicon germanium source drain 40 may be grown which fills the trench 24 and extends thereabove as indicated at FIG. 5. The trench 24 may be filled using silicon germanium having 10-40 atomic percent germanium. Source drain doping may be done by in-situ doping using a diborane source. The epitaxial source drain 40 only grows in the trench 24 because all other material is masked or covered. The source drain 40 is raised and continues to grow until the facets meet. A source drain implant may be used thereafter in some embodiments.

Figure 6:
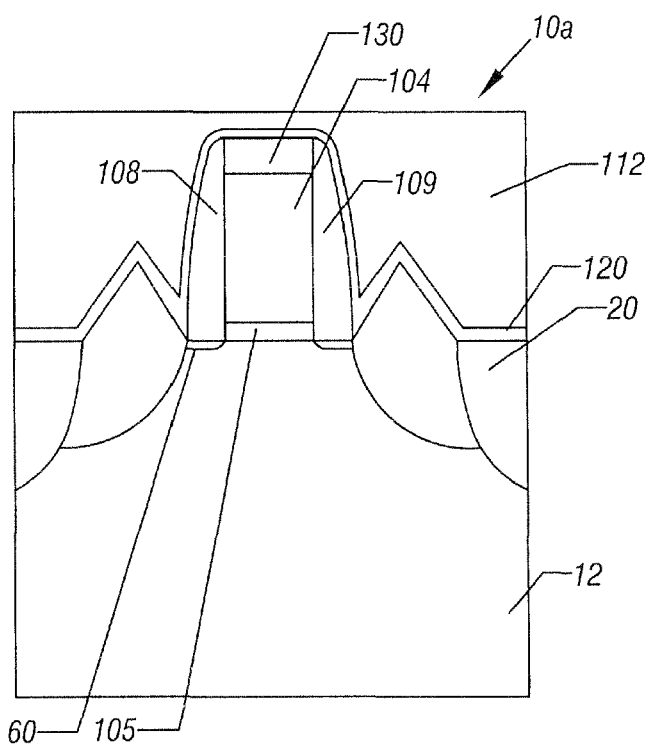
FIG. 6 is an enlarged, cross-sectional view at a stage subsequent to the stage shown in FIG. 5 in accordance with one embodiment of the present invention.
Figure 7:
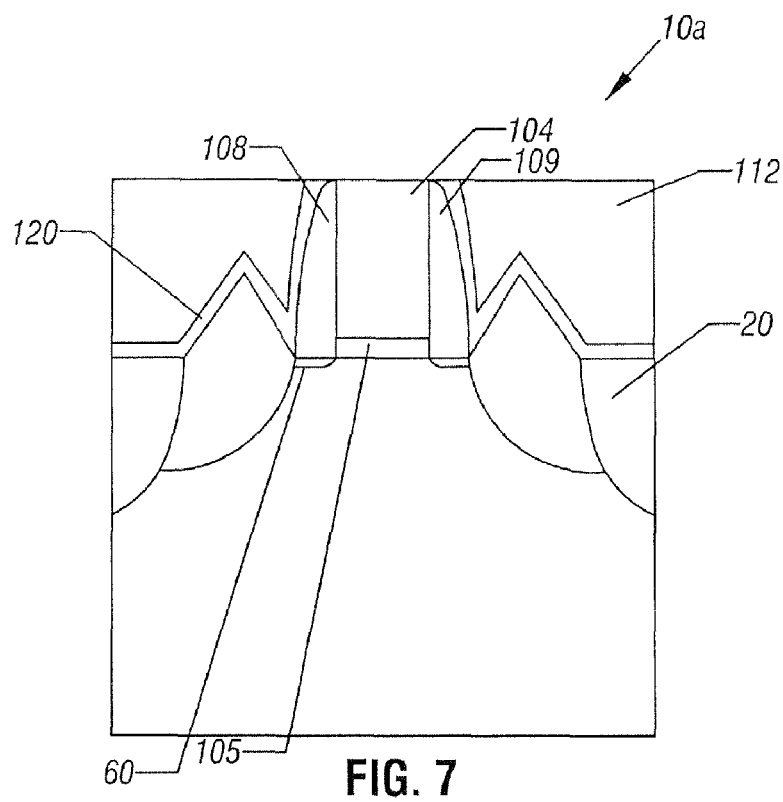
FIG. 7 is an enlarged, cross-sectional view at a stage subsequent to the stage shown in FIG. 6 in accordance with one embodiment of the present invention.

As is shown in FIG. 6, after the masking of the NMOS side is removed, the structure of FIG. 3 may be covered by an insulating layer 112, such as a low dielectric constant material such as oxide and a nitride etch stop layer (NESL) 120. The layer 112 may be doped with phosphorus, boron, or other materials and may be formed by high density plasma deposition. The layer 112 may then be planarized down to the upper surface of the gate material 104 thereby removing the hard mask 130 and the NESL 120, as shown in FIG. 7. The layer 120 may be nitride. It helps the NMOS side by acting as an etch stop and a tensile layer, but may degrade the PMOS side 10a by producing strain. Thus, removing the NESL 120 on the PMOS side 10a may improve performance.

Figure 8:
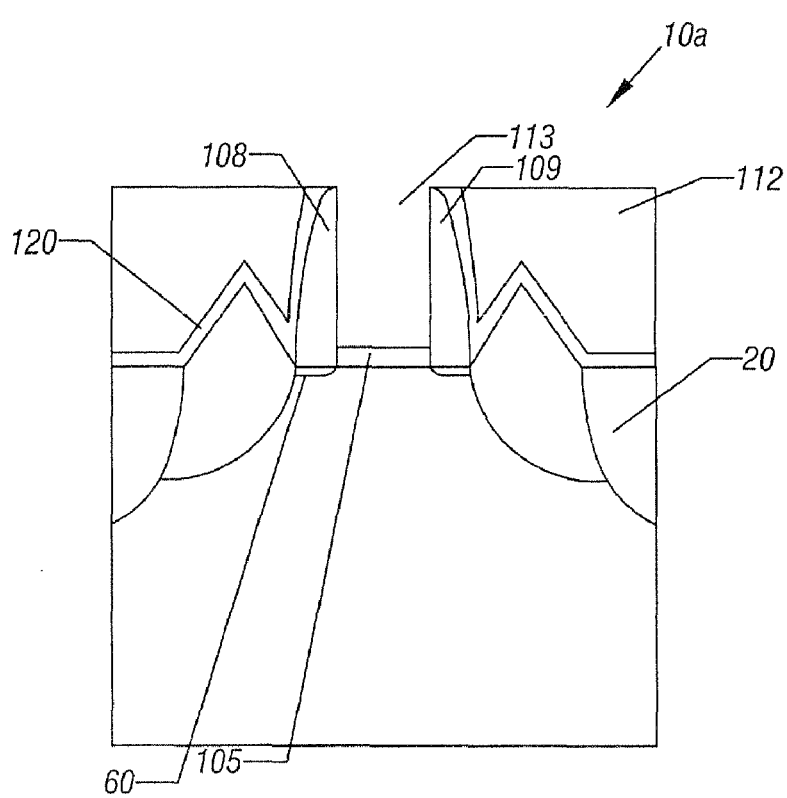
FIG. 8 is an enlarged, cross-sectional view at a stage subsequent to the stage shown in FIG. 7 in accordance with one embodiment of the present invention.
Figure 9:
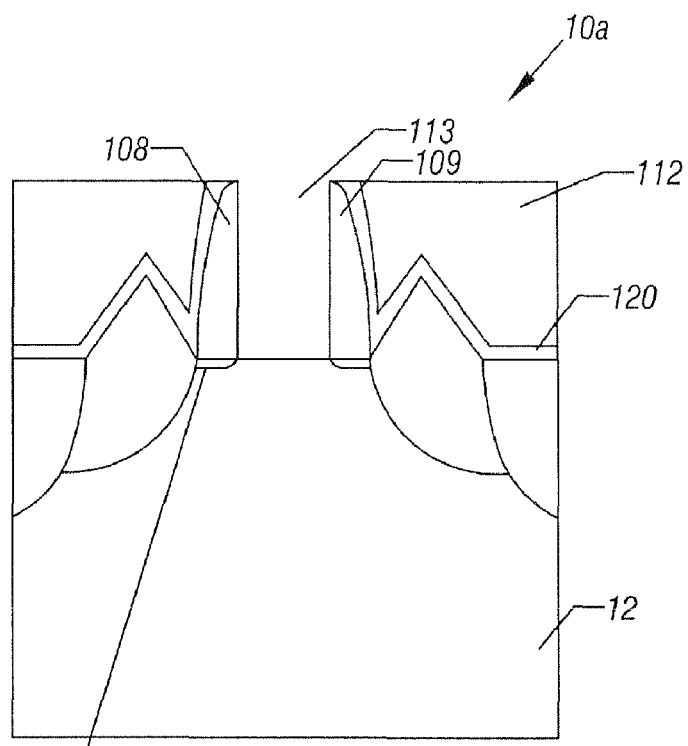
FIG. 9 is an enlarged, cross-sectional view at a stage subsequent to the stage shown in FIG. 8 in accordance with one embodiment of the present invention.

As is shown in FIG. 8, the gate material 104 may be removed to form a trench 113 over the remaining gate oxide 105. Removal of the gate material 104 may be done, for example, by any of a variety of techniques including selective etching of the gate material 104 relative to the gate material of the NMOS transistor or shielding the NMOS transistor during the process shown in FIG. 8.

Gate material 104 is removed to generate trench 113 that is positioned between sidewall spacers 108, 109—producing the structure shown in FIG. 8. In one embodiment, a wet etch process that is selective for material 104 over the corresponding material of the NMOS transistor (not shown) may be applied to remove material 104 without removing significant portions of NMOS material.

The layer 104 may be selectively removed in some embodiments. In one embodiment, layer 104 is exposed to a solution that comprises between about 20 and about 30 percent tetramethyl ammonium hydroxide (TMAH) by volume in deionized water for a sufficient time at a sufficient temperature (e.g., between about 60° C. and about 90° C.), while applying sonic energy, to remove all of layer 106 without removing significant portions of any NMOS transistor structure (not shown).

Alternatively, a dry etch process may be applied to selectively remove layer 104. When gate layer 104 is doped p-type (e.g., with boron), such a dry etch process may comprise exposing sacrificial gate electrode layer 104 to a plasma derived from sulfur hexafluoride ("$SF_6$"), hydrogen bromide ("HBr"), hydrogen iodide ("HI"), chlorine, argon, and/or helium. Such a selective dry etch process may take place in a parallel plate reactor or in an electron cyclotron resonance etcher.

After removing material 104, dielectric layer 105 is removed. When dielectric layer 105 comprises silicon dioxide, it may be removed using an etch process that is selective for silicon dioxide to generate the FIG. 9 structure. Such etch processes include: exposing layer 105 to a solution that includes about 1 percent hydrofluoric acid (HF) in deionized water, or applying a dry etch process that employs a fluorocarbon based plasma. Layer 105 may be exposed for a limited time, as the etch process for removing layer 105 may also remove part of dielectric layer 112. With that in mind, if a 1 percent HF based solution is used to remove layer 105, the device may be exposed to that solution for less than about 60 seconds, for example for about 30 seconds or less. It may be possible to remove layer 105 without removing a significant amount of dielectric layer 112, if layer 105 is less than about 30 Angstroms thick, when initially deposited.

Figure 10:
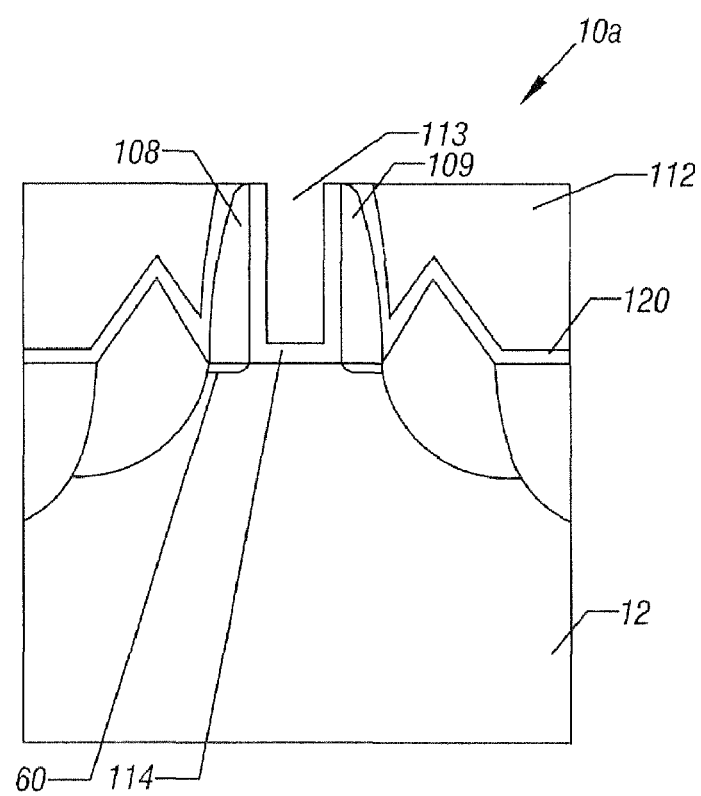
FIG. 10 is an enlarged, cross-sectional view at a stage subsequent to the stage shown in FIG. 9 in accordance with one embodiment of the present invention.

Next, a new gate dielectric 114 may be deposited and planarized to have a u-shape, lining the opening 113, as shown in FIG. 10. Although gate dielectric layer 114 may comprise any material that may serve as a gate dielectric for a PMOS transistor that includes a metal gate electrode, gate dielectric layer 114 may comprise a high dielectric constant (k) metal oxide dielectric material which has a dielectric constant greater than ten. Some of the materials that may be used to make high-k gate dielectric 114 include: hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Particularly useful metal oxides include hafnium oxide, zirconium oxide, and aluminum oxide. Although a few examples of metal oxides that may be used to form high-k gate dielectric layer 114 are described here, that layer may be made from other metal oxides as well.

High-k gate dielectric layer 114 may be formed on substrate 100 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and high-k gate dielectric layer 114. The CVD reactor should be operated long enough to form a layer with the desired thickness. In most applications, high-k gate dielectric layer 114 may, for example, be less than about 60 Angstroms thick and, in one embodiment, between about 5 Angstroms and about 40 Angstroms thick.

When an atomic layer CVD process is used to form high-k gate dielectric layer 114, that layer will form on the vertical sides of trench 113 in addition to forming on the bottom of that trench. If high-k gate dielectric layer 114 comprises an oxide, it may manifest oxygen vacancies at random surface sites and unacceptable impurity levels, depending upon the process used to make it. It may be desirable to remove impurities from layer 114, and to oxidize it to generate a layer with a nearly idealized metal:oxygen stoichiometry, after layer 114 is deposited.

To remove impurities from that layer and to increase that layer's oxygen content, a wet chemical treatment may be applied to high-k gate dielectric layer 114. Such a wet chemical treatment may comprise exposing high-k gate dielectric layer 114 to a solution that comprises hydrogen peroxide at a sufficient temperature for a sufficient time to remove impurities from high-k gate dielectric layer 114 and to increase the oxygen content of high-k gate dielectric layer 114. The appropriate time and temperature at which high-k gate dielectric layer 114 is exposed may depend upon the desired thickness and other properties for high-k gate dielectric layer 114.

When high-k gate dielectric layer 114 is exposed to a hydrogen peroxide based solution, an aqueous solution that contains between about 2% and about 30% hydrogen peroxide by volume may be used. That exposure step may take place at between about 15° C. and about 40° C. for at least about one minute. In a particularly preferred embodiment, high-k gate dielectric layer 114 is exposed to an aqueous solution that contains about 6.7% $H_2O_2$ by volume for about 10 minutes at a temperature of about 25° C. During that exposure step, it may be desirable to apply sonic energy at a frequency of between about 10 KHz and about 2,000 KHz, while dissipating at between about 1 and about 10 Watts/cm². In one embodiment, sonic energy may be applied at a frequency of about 1,000 KHz, while dissipating at about 5 Watts/cm².

Figure 11:
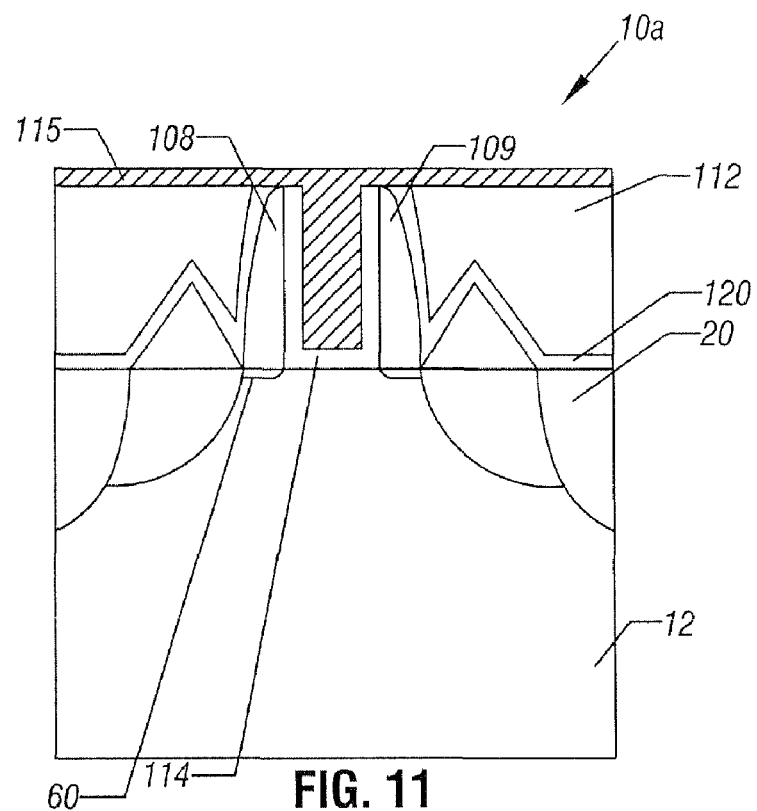
FIG. 11 is an enlarged, cross-sectional view at a stage subsequent to the stage shown in FIG. 10 in accordance with one embodiment of the present invention.
Figure 12:
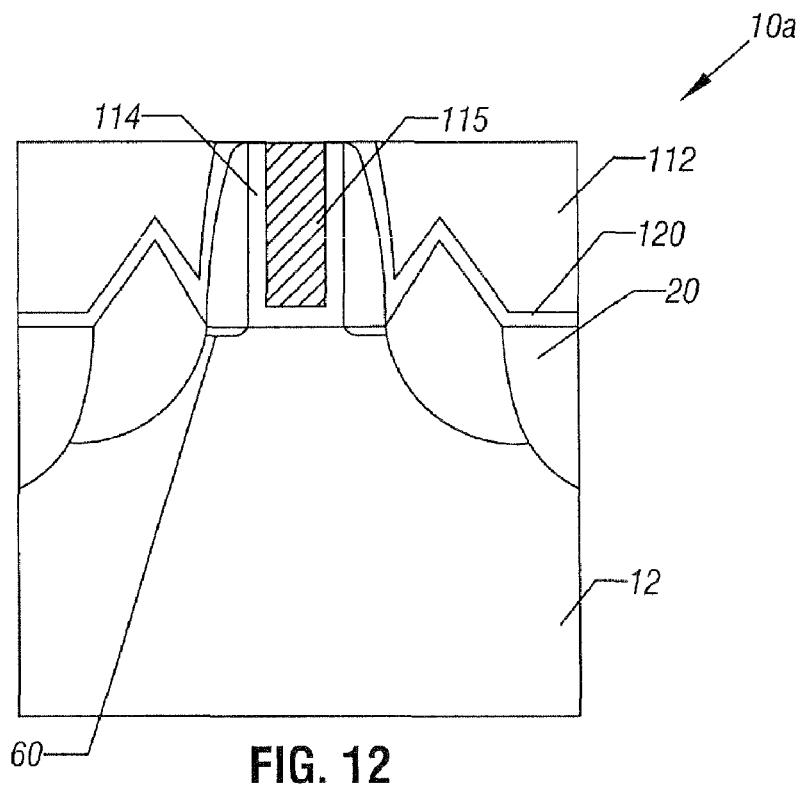
FIG. 12 is an enlarged, cross-sectional view at a stage subsequent to the stage shown in FIG. 11 in accordance with one embodiment of the present invention.

A gate metal 115 may be deposited into the trench 113, overlapping the insulating material 112, as shown in FIG. 11. The gate metal may be planarized to form a metal gate electrode 115 shown in FIG. 12.

The p-type metal layer 115 may fill trench 113 to generate. P-type metal layer 115 may comprise any p-type conductive material from which a metal PMOS gate electrode may be derived and which compressively strains the channel to this end. The p-type metal layer may be one with a higher coefficient of thermal expansion than that of the substrate 100, which may be silicon. Examples of suitable metals includes boron carbide, tungsten, molybdenum, rhodium, vanadium, platinum, ruthenium, beryllium, palladium, cobalt, titanium, nickel, copper, tin, aluminum, lead, zinc, alloys, and silicides of these materials. In one embodiment, the use of a material having a coefficient of thermal expansion higher than that of tungsten ($0.4 \times 10^{-5}$ in./in./° C.) is advantageous. A relatively high deposition temperature, such as 400° C., may be used in some embodiments, generating compressive strain in the channel and improving mobility. P-type metal layer 115 preferably has thermal stability characteristics that render it suitable for making a metal PMOS gate electrode for a semiconductor device.

Materials that may be used to form p-type metal layer 115 include: ruthenium, palladium, platinum, cobalt, nickel, and conductive metal oxides, e.g., ruthenium oxide. The metal of the layer 115 may be the same or different than the metal component of the metal oxide dielectric layer 105. P-type metal layer 115 may be formed on gate dielectric layer 105 using well known PVD or CVD processes, e.g., conventional sputter or atomic layer CVD processes. P-type metal layer 115 is removed except where it fills trench 113. Layer 115 may be removed from other portions of the device via a wet or dry etch process, or an appropriate CMP operation, with dielectric 112 serving as an etch or polish stop.

The p-type metal layer 115 may compensate for a threshold voltage shift due to the silicon germanium raised source drain 40. The workfunction of the metal layer 115 may be adjusted or selected so as to compensate for the threshold voltage shift that necessarily results from using the raised source drain 40. Generally, the raised source drain 40 causes the valence to go up, and to lower the threshold voltage. Thus, it may be desired to use a mid-gap metal as the layer 115, whose workfunction may compensate for the threshold voltage shift.

P-type metal layer 115 may serve as a metal PMOS gate electrode with a workfunction that is between about 4.9 eV and about 5.2 eV, and that may, for example, be between about 10 Angstroms and about 2,000 Angstroms thick and, in one embodiment, is between about 500 Angstroms and about 1,600 Angstroms thick.

Figure 13:
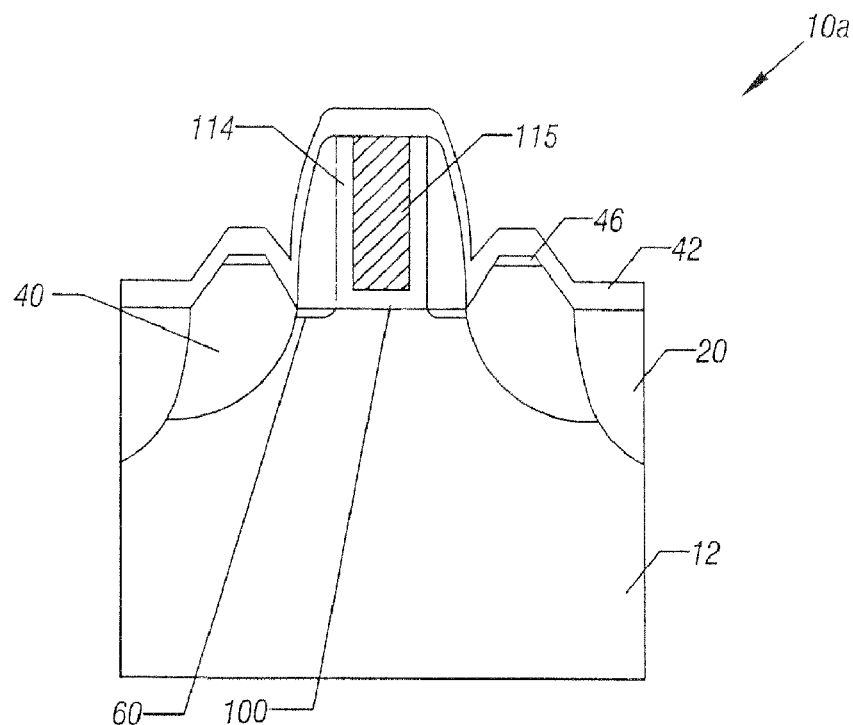
FIG. 13 is an enlarged, cross-sectional view at a stage subsequent to the stage shown in FIG. 12 in accordance with one embodiment of the present invention.

The structure shown in FIG. 13 may then be completed by forming silicide contacts 46, and the nitride etch stop layer 42.

The nitride etch stop layer 42 may be provided after the contacts 46 have been formed.

In some embodiments of the present invention, the epitaxial silicon germanium raised source drains 40 compressively strain the PMOS channel 100 to improve mobility and reduce external resistance. This may be achieved, in some embodiments, by in-situ boron doping the source drain regions 40, lowering the Schottky energy barrier for hole injection, thereby improving contact resistance.

The replacement metal gate process may reduce polysilicon depletion while synergistically relieving tensile strain in the PMOS device during the polysilicon opening polish (FIG. 7) and/or the etch of the nitride etch stop layer 42 used in forming the contacts. The PMOS device may benefit by reducing tensile strain that degrades hole mobility.

The replacement metal gate electrode 115 may be tuned for the PMOS transistor with or without using high dielectric constant (greater than 10) dielectrics or the gate dielectric 114 for eliminating polysilicon depletion and reducing gate leakage. A polish and/or removal of the tensile strained NESL 120 over the PMOS device 10a during the replacement metal gate flow may improve PMOS mobility.

Figure 14:
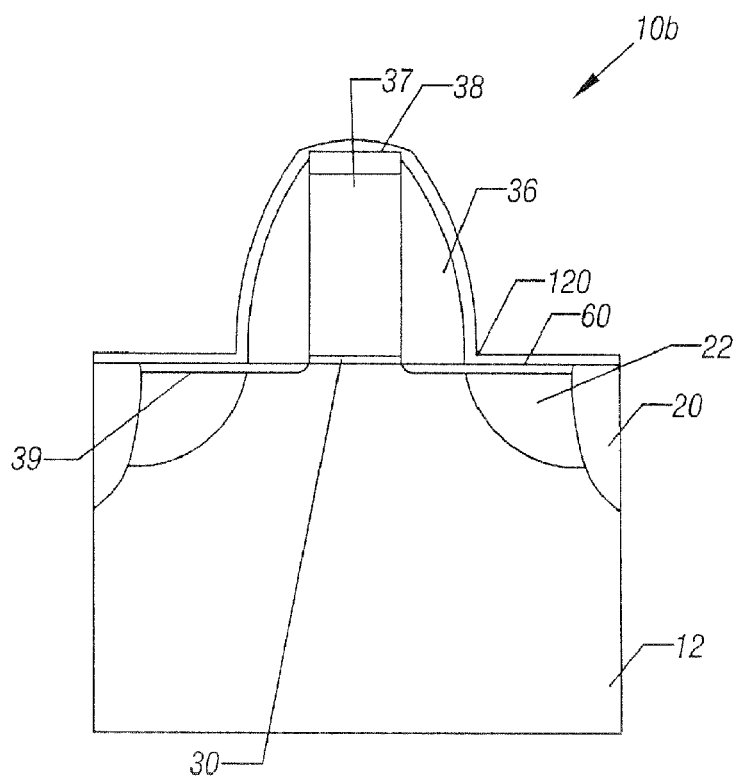
FIG. 14 is a depiction of one embodiment of an NMOS transistor for use with the PMOS transistor shown in FIG. 13 in accordance with one embodiment of the present invention.

The fabrication of the NMOS transistor 10b, shown in FIG. 14, proceeds according to a conventional technology. For example, the NMOS transistor 10b may have a graded junction including a shallow tip/source/drain 39 and a deep source drain 22 which may be made by ion implantation. In some embodiments strain may or may not be introduced. In some embodiments, the gate 37 is a replacement metal gate and in other embodiments, a convention polysilicon gate may be utilized. The gate 37 may be covered by the silicide contact 38. The NESL 120 may be retained on the NMOS side 10b.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A semiconductor structure comprising:
    a metal gate electrode having a coefficient of thermal expansion greater than $0.4 \times 10^{-5}$ in./in./degree C.;
    a substrate having trenches;
    sidewall spacers on said gate electrode;
    trenches in said substrate aligned with said sidewall spacers;
    raised source and drains, each formed in one of said trenches; and
    a compressively strained channel under said metal gate electrode.

2. The structure of claim 1 wherein said p-type raised source drain is formed of silicon and germanium.

3. The structure of claim 1 including a U-shaped gate dielectric.

4. The structure of claim 3 including a gate dielectric having a dielectric constant greater than 10.

5. The structure of claim 1 wherein said gate electrode is formed from a material selected from the group consisting of ruthenium, palladium, platinum, cobalt, nickel, and conductive metal oxides.

* * * * *